(12) United States Patent
Sung et al.

(10) Patent No.: US 9,875,905 B2
(45) Date of Patent: Jan. 23, 2018

(54) FINFET DEVICES HAVING FINS WITH A TAPERED CONFIGURATION AND METHODS OF FABRICATING THE SAME

(71) Applicant: GLOBALFOUNDRIES, Inc., Grand Cayman (KY)

(72) Inventors: Min Gyu Sung, Latham, NY (US); Ruilong Xie, Niskayuna, NY (US); Catherine B. Labelle, Schenectady, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 10 days.

(21) Appl. No.: 14/920,179

(22) Filed: Oct. 22, 2015

(65) Prior Publication Data

US 2017/0117156 A1   Apr. 27, 2017

(51) Int. Cl.

| | |
|---|---|
| *H01L 21/308* | (2006.01) |
| *H01L 29/78* | (2006.01) |
| *H01L 29/66* | (2006.01) |
| *H01L 21/311* | (2006.01) |
| *H01L 21/3105* | (2006.01) |
| *H01L 29/06* | (2006.01) |

(52) U.S. Cl.
CPC .... *H01L 21/3081* (2013.01); *H01L 21/31053* (2013.01); *H01L 21/31127* (2013.01); *H01L 21/31144* (2013.01); *H01L 29/0657* (2013.01); *H01L 29/66795* (2013.01); *H01L 29/785* (2013.01)

(58) Field of Classification Search
CPC ........... H01L 29/785; H01L 21/823821; H01L 21/823431
See application file for complete search history.

(56) References Cited

U.S. PATENT DOCUMENTS

| | | | |
|---|---|---|---|
| 2013/0043506 A1* | 2/2013 | Tsai ................. | H01L 29/66795 257/192 |
| 2014/0191296 A1* | 7/2014 | Bergendahl ......... | H01L 29/7855 257/288 |
| 2016/0247730 A1* | 8/2016 | You ................. | H01L 21/823431 |
| 2016/0336428 A1* | 11/2016 | Cheng ............... | H01L 29/66795 |

* cited by examiner

*Primary Examiner* — Daniel Whalen
*Assistant Examiner* — Suberr Chi
(74) *Attorney, Agent, or Firm* — Lorenz & Kopf, LLP

(57) ABSTRACT

FinFET devices and methods of fabricating a FinFET device are provided. An exemplary method of fabricating a FinFET device includes providing a semiconductor substrate with a plurality of fins and a multi-layered hardmask stack formed thereover. The multi-layered hardmask stack is patterned to form a patterned multi-layered hardmask stack having a tapered fin masking configuration with a shortened region and an elongated region. A region of fins adjacent to the shortened region is masked with a second mask. The region of fins masked with the second mask is free from the patterned multi-layered hardmask stack. Fins in unmasked areas are etched after forming the second mask. The second mask is removed with at least one layer of the patterned multi-layered hardmask stack remaining after etching the fins in the unmasked areas. End portions of the fins adjacent to the shortened region are etched after removing the second mask.

19 Claims, 16 Drawing Sheets

FINFET DEVICES HAVING FINS WITH A TAPERED CONFIGURATION AND METHODS OF FABRICATING THE SAME

TECHNICAL FIELD

The technical field generally relates to fin field effect transistor (FinFET) devices having fins with a tapered configuration and methods of fabricating the same, and more particularly relates to FinFET devices with ends of shorter fins in the tapered configuration effectively buried beneath a gate electrode structure and methods of fabricating the FinFETs.

BACKGROUND

Transistors such as metal oxide semiconductor field effect transistors (MOSFETs) or simply field effect transistors (FETs) are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be improved as the transistor size decreases.

A fin field-effect transistor (FinFET) is a type of transistor that lends itself to the dual goals of reducing transistor size while increasing transistor performance. The FinFET is a three dimensional transistor formed in a thin fin that extends upwardly from a semiconductor substrate. Transistor performance, often measured by its transconductance, is proportional to the width of the transistor channel. In a FinFET the transistor channel is formed along the vertical sidewalls of the fin or on both vertical sidewalls and the top horizontal plane of the fin, so a wide channel, and hence high performance, can be achieved without substantially increasing the area of the substrate surface required by the transistor.

Formation of FinFETs generally first involves fin formation on or in a semiconductor substrate. The fins are uniformly formed across a surface of the semiconductor substrate, but it is often desirable to selectively remove portions of the fins for various chip layout/architecture considerations, thereby producing a tapered configuration whereby a region of longer fins are disposed adjacent to a region of shorter fins. In particular, selective removal of portions of the fins is generally conducted by patterning a mask over the fins to expose portions of the fins to be removed, followed by isotropic etching with an etchant that is selective to the semiconductor material of the fins. Gate electrode structures are uniformly formed over the fins in an array. Thus, some gate electrode structures are disposed over both the longer fins and the shorter fins and some gate electrode structures are disposed only over the longer fins. Additionally, one of the gate electrode structures is disposed over the longer fins and over ends of the shorter fins to effectively "tuck" or bury the ends of the shorter fins beneath the gate electrode structures, thereby masking the ends of the shorter fins to avoid epitaxial growth of semiconductor material at the ends of the shorter fins during further front-end-of-line (FEOL) fabrication techniques.

While it is desirable to completely cover or mask the ends of the shorter fins beneath the gate electrode structures, sharp definition of fin ends for the shorter fins is difficult to achieve, primarily due to etch selectivities during selective removal of portions of the fins. As a result and as illustrated schematically in FIG. 1, the shorter fins 112 may have unpredictable and non-uniform lengths. With the unpredictable and non-uniform lengths of the shorter fins 112, masking the ends 114 of the shorter fins 112 may be difficult or impossible, thereby leaving ends 114 of the shorter fins 112 exposed after formation of the gate electrode structure 116. As schematically illustrated in FIG. 2, unwanted epitaxial growth of semiconductor material 118 may occur at the unmasked ends 114 of the shorter fins 112 during subsequent FEOL fabrication techniques.

Accordingly, it is desirable to fabricate FinFETs having fins with a tapered configuration where a predictable and substantially uniform fin length of the shortened fins is obtained to enable the ends of the shorter fins to be buried beneath the gate electrode structure. In addition, it is desirable to provide FinFET devices having fins with a tapered configuration and with ends of the shorter fins tucked beneath the gate electrode structure. Furthermore, other desirable features and characteristics will become apparent from the subsequent detailed description and the appended claims, taken in conjunction with the accompanying drawings and this background.

BRIEF SUMMARY

FinFET devices and methods of fabricating a FinFET device are provided herein. In an embodiment, a method of fabricating a FinFET device includes providing a semiconductor substrate that includes a plurality of fins. A multi-layered hardmask stack is formed over the plurality of fins. The multi-layered hardmask stack is patterned to form a patterned multi-layered hardmask stack having a tapered fin masking configuration with a shortened region and an elongated region. A region of fins adjacent to the shortened region of the patterned multi-layered hardmask stack is masked with a second mask. The region of fins masked with the second mask is free from the patterned multi-layered hardmask stack. Fins in unmasked areas are etched after forming the second mask. The second mask is removed with at least one layer of the patterned multi-layered hardmask stack remaining disposed over the fins after etching the fins in the unmasked areas. End portions of the fins adjacent to the shortened region of the patterned multi-layered hardmask stack are etched after removing the second mask.

In another embodiment, a method of fabricating a FinFET device includes providing a semiconductor substrate comprising a plurality of fins. A multi-layered hardmask stack is formed over the plurality of fins. The multi-layered hardmask stack includes two organic planarization layers with a separation layer disposed therebetween. The separation layer includes a different material from the organic planarization layers. The multi-layered hardmask stack is patterned to form a patterned multi-layered hardmask stack having a tapered fin masking configuration with a shortened region and an elongated region. A region of fins adjacent to the shortened region of the patterned multi-layered hardmask stack is masked with a second mask. The region of fins masked with the second mask is free from the patterned multi-layered hardmask stack. Fins in unmasked areas are etched after forming the second mask. The second mask and an uppermost organic planarization layer in the multi-layered hardmask stack are concurrently removed with at least a portion of the separation layer remaining after removal of the second mask and the uppermost organic planarization layer. End portions of the fins adjacent to the shortened region of the patterned multi-layered hardmask stack in the unmasked areas are etched after removing the second mask. A lowermost organic planarization layer of the multi-layered hardmask stack remains in place during etching of the end portions of the fins adjacent to the shortened region of the patterned multi-layered hardmask stack.

In another embodiment, a FinFET device includes a semiconductor substrate having a plurality of fins. The plurality of fins includes elongated fins and shortened fins. The semiconductor substrate defines trenches in portions thereof directly underlying an axis passing through a longitudinal dimension of the shortened fins. A gate electrode structure is disposed over the fins with ends of the shortened fins buried directly beneath the gate electrode structure.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
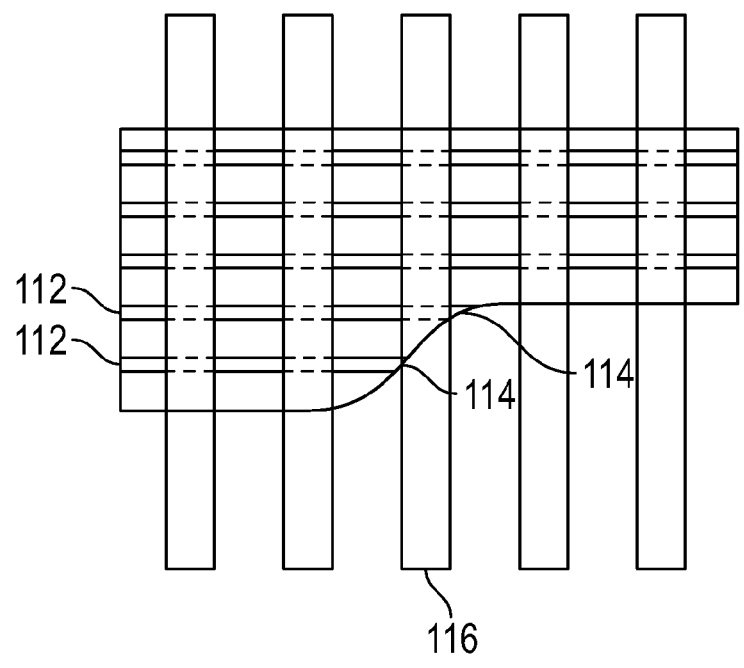
FIGS. 1 and 2 are top schematic views of a FinFET device having fins in a tapered configuration with shorter fins having unpredictable and non-uniform lengths.
Figure 2:
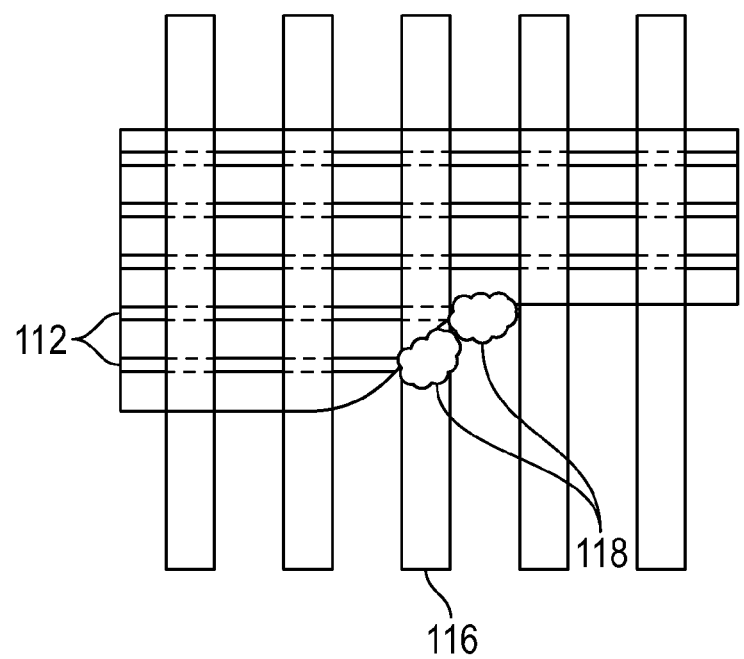
Figure 3:
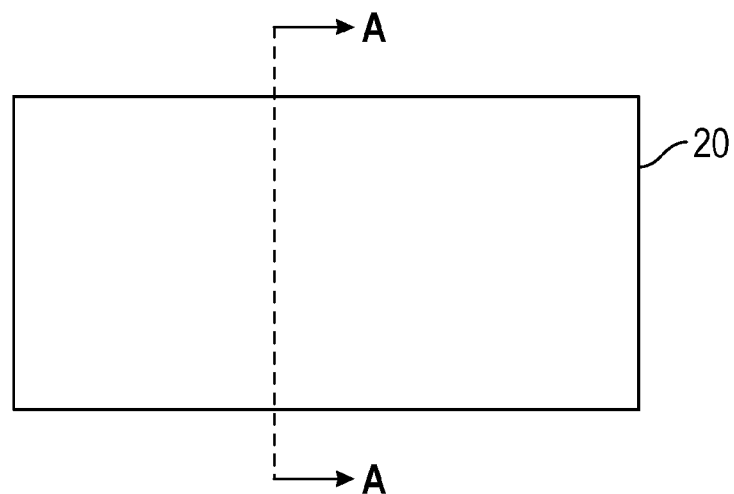
FIGS. 3-32 are top schematic views and corresponding cross-sectional schematic side views of a FinFET device and a method for fabricating the FinFET device having fins with a tapered configuration in accordance with an embodiment, with odd numbered figures representing top views of the corresponding even numbered cross-sectional side views taken along line A-A or B-B of the corresponding top views.

The following detailed description is merely exemplary in nature and is not intended to limit the fin field effect transistor (FinFET) devices and methods of fabricating the same as set forth herein. Furthermore, there is no intention to be bound by any theory presented in the preceding background or the following detailed description. Embodiments of the present disclosure are generally directed to integrated circuits, particularly FinFET devices, and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

FinFET devices having fins with a tapered configuration and methods of fabricating the FinFET devices are provided. A predictable and substantially uniform fin length of the shortened fins in the tapered configuration is obtained by first patterning a multi-layered hardmask stack to form a patterned multi-layered hardmask stack having a tapered fin masking configuration with a shortened region corresponding to shortened fins in the final tapered configuration and an elongated regions corresponding to longer fins in the final tapered configuration of the fins. A region of fins that is adjacent to the shortened region of the patterned multi-layered hardmask stack is masked with a second mask. Fins in unmasked areas are etched after forming the second mask, followed by removing the second mask. At least one layer of the patterned multi-layered hardmask stack remains disposed over the fins after etching the fins in unmasked areas so as to maintain the configuration of the final tapered configuration of the fins. End portions of fins adjacent to the shortened region of the patterned multi-layered hardmask stack are etched after removing the second mask. By masking the end portions of the fins adjacent to the shortened region of the patterned multi-layered hardmask stack during the first etch, when the bulk of the fins to be removed are etched, e.g., through an isotropic etching technique, undesired sub-mask etching of the fins beneath the shortened region of the patterned multi-layered hardmask can be avoided while later etching the end portions after removal of the second mask, e.g., through an anisotropic etching technique to avoid substantial horizontal etching of the fins beneath the patterned multi-layered hardmask while producing sharp, well-controlled definition of the ends of the fins in the shortened region. In this manner, the predictable and substantially uniform fin length of the shortened fins in the tapered configuration can be obtained, which enables the ends of the shorter fins to be effectively buried beneath a gate electrode structure.

Figure 4:
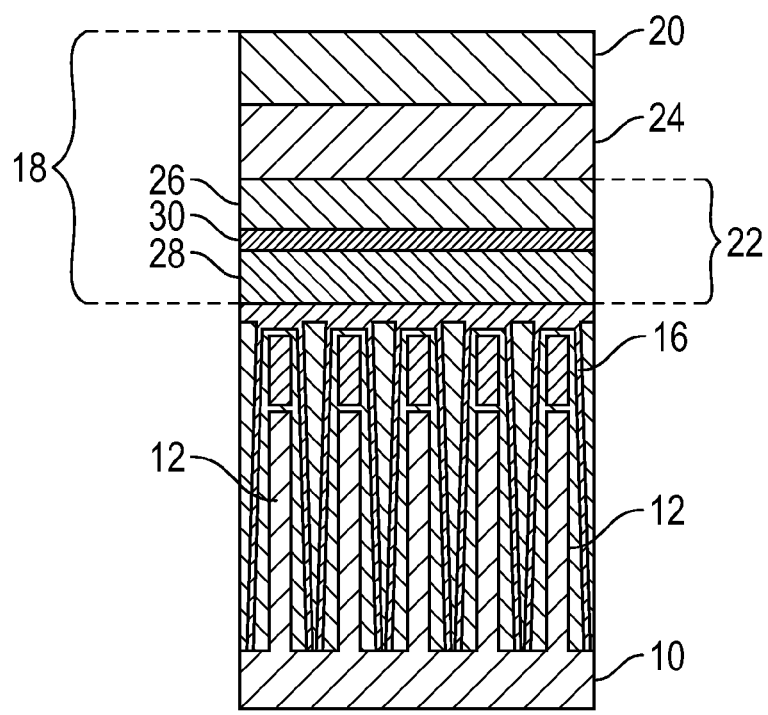
Figure 5:
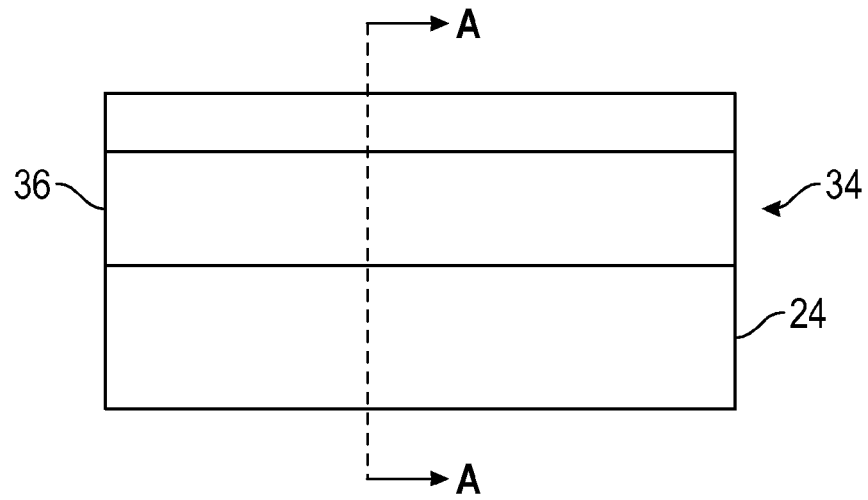
Figure 6:
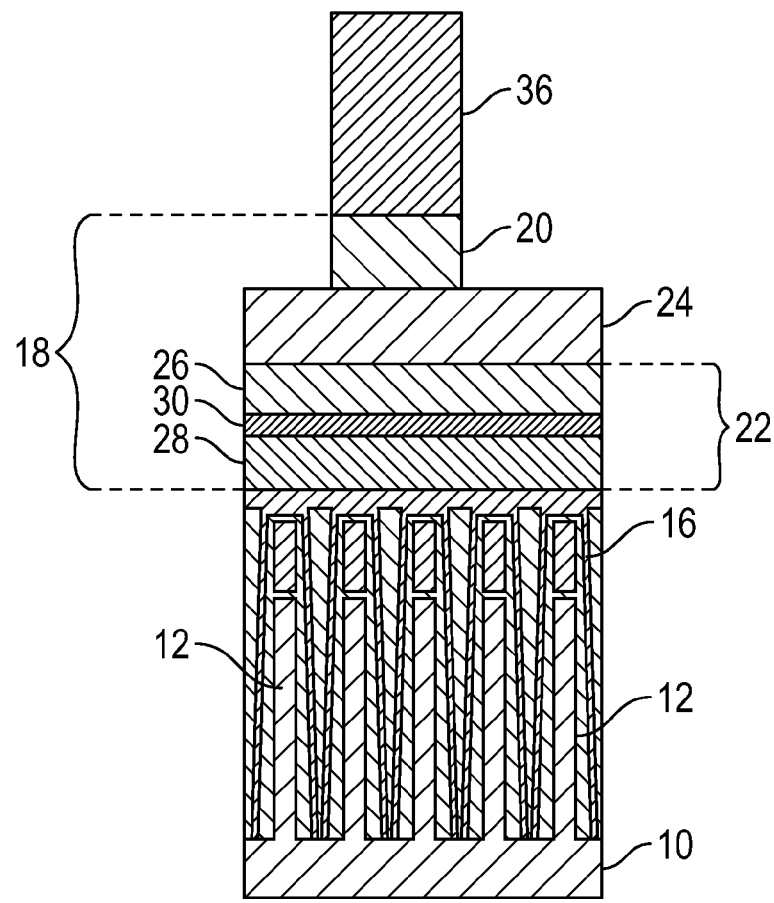
Figure 7:
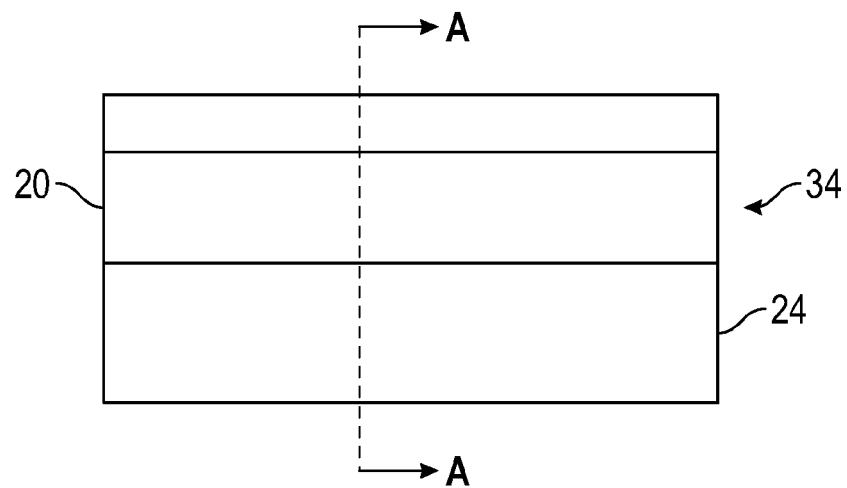
Figure 8:
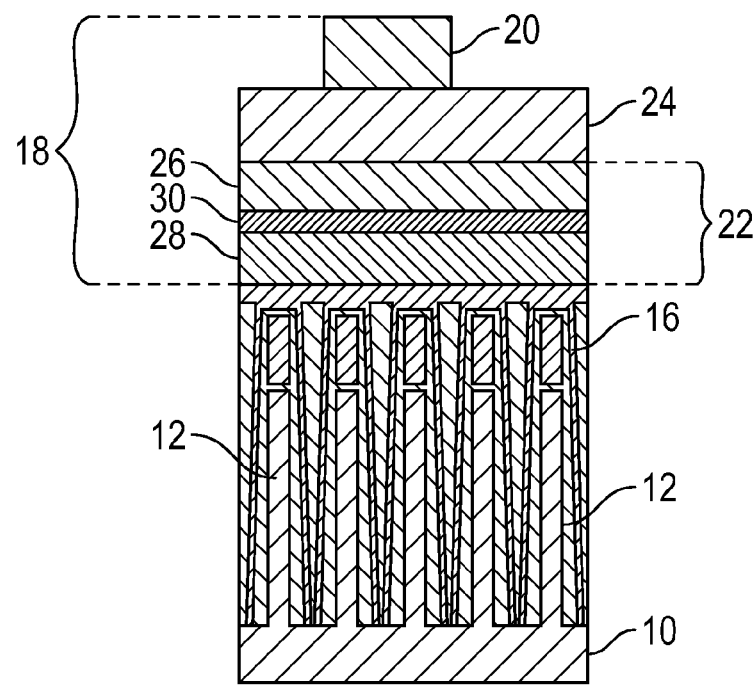

A method of fabricating a FinFET device will now be described with reference to FIGS. 3-32. In an embodiment and as shown in FIG. 4, a semiconductor substrate 10 is provided that includes a plurality of fins 12 disposed in parallel relationship. Although only a few fins 12 are shown, it is to be appreciated that the semiconductor substrate 10 may include numerous additional fins 12 in accordance with conventional FinFET technology. Without intending to be limiting, the fins 12 may have a width on the nanometer scale, such as from about 5 to about 20 nm, although the FinFET devices and methods described herein are not limited to any particular dimensional constraints. As used herein, the term "semiconductor substrate" will be used to encompass semiconductor materials that are conventionally used in the semiconductor industry. "Semiconductor materials" include monocrystalline silicon materials, such as relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In the embodiment shown in FIGS. 3-32, the semiconductor substrate 10 is a bulk silicon wafer with the fins 12 formed in the bulk silicon wafer. However, it is to be appreciated that in other embodiments and although not shown in the Figures, the semiconductor substrate 10 may include a silicon-containing material that is disposed on an insulating material, commonly known as a silicon-on-insulator (SOI) structure that, in turn, may be supported by a support substrate.

In embodiments and referring again to FIG. 4, a cap layer 16 is disposed over the fins 12. As used herein, the terms "overlying" or "over" are understood to mean "over" such that an intervening layer may lie between the overlying structure and the underlying structure, or "on" such that the overlying structure directly contacts the underlying structure. The cap layer 16 may include one or more individual layers of dielectric material, such as a nitride layer. In embodiments, the cap layer 16 is disposed directly over and on the fins 12 to physically separate the fins 12 from further layers that are formed thereover. As used herein, the terms "directly over" or "directly overlying" mean that the recited features are disposed such that a vertical line passing through the upper component also passes through the lower component, with at least a portion of the upper component directly over at least a portion of the lower component. It is understood that views of the FinFET devices may be rotated such that the relative "up" and "down" positions change, so reference to a "vertical" line means a line that is about perpendicular to the surface of the semiconductor substrate 10. In embodiments, the cap layer 16 includes a nitride layer formed over an oxide layer, although it is to be appreciated that alternative layer configurations may be employed for the cap layer 16.

In embodiments and referring again to FIG. 4, a multi-layered hardmask stack 18 is formed over the plurality of fins 12, with the cap layer 16 disposed between the fins 12 and multi-layered hardmask stack 18. The multi-layered hardmask stack 18 includes a plurality of layers having different etch rates in different etchants to enable selective patterning of the multi-layered hardmask stack 18. In embodiments, the multi-layered hardmask stack 18 includes an uppermost layer 20 that includes material having substantially the same etch rate as the cap layer 16 in a first etchant. For example, in embodiments, the cap layer 16 includes a nitride and the uppermost layer 20 also includes a nitride, such as silicon nitride. The uppermost layer 20 of the multi-layered hardmask stack 18 is disposed over a sandwiched structure 22. More specifically, the sandwiched structure 22 is disposed between the uppermost layer 20 of the multi-layered hardmask stack 18 and the cap layer 16 that is disposed over the fins 12. In a specific embodiment, the uppermost layer 20 includes a conventional low temperature nitride (LTN) due to the presence of temperature-sensitive organic layers within the multi-layered hardmask stack 18, as described in further detail below. In embodiments and as shown in FIG. 4, the multi-layered hardmask stack 18 further includes an intermediate layer 24 disposed between the uppermost layer 20 and the sandwiched structure 22, with the intermediate layer 24 including a material having a different etch rate than the uppermost layer 20. For example, the intermediate layer 24 may include an oxide, such as silicon oxide, to enable selective etching between the uppermost layer 20 and the intermediate layer 24. In a specific embodiment, the intermediate layer 24 includes a conventional low temperature oxide (LTO). In embodiments, the sandwiched structure 22 includes two organic planarization layers (OPL) 26, 28 including a conventional organic planarization layer material (i.e., a carbon-containing material) with a separation layer 30 disposed therebetween and with the separation layer 30 including a different material from the organic planarization layers 26, 28. For example, in embodiments, the separation layer 30 is an in-situ radical-deposited (IRAD) oxide layer, which has a different etch rate in specific OPL etchants to enable selective etching of the OPL layers 26, 28 over the separation layer 30. In embodiments, the IRAD oxide layer includes silicon oxide and is substantially free of carbon. Examples of specific etchants and etching techniques for the various layers are described in further detail below.

Figure 9:
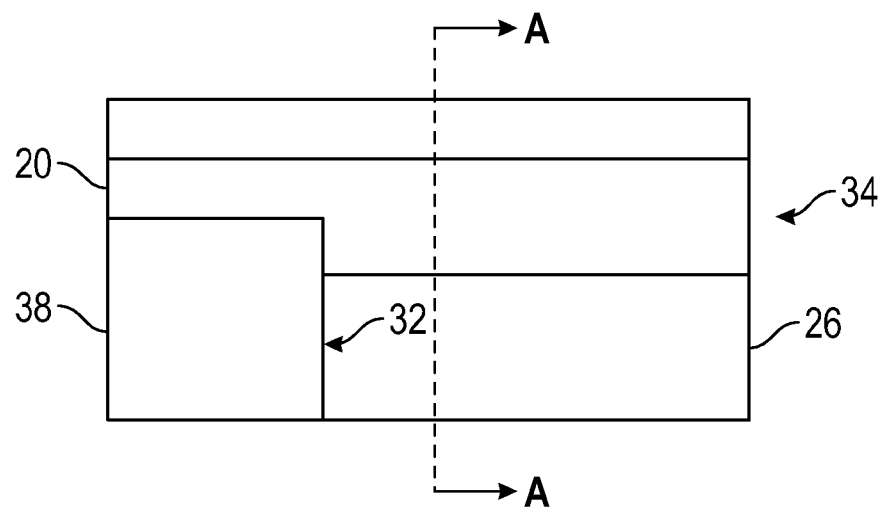
Figure 10:
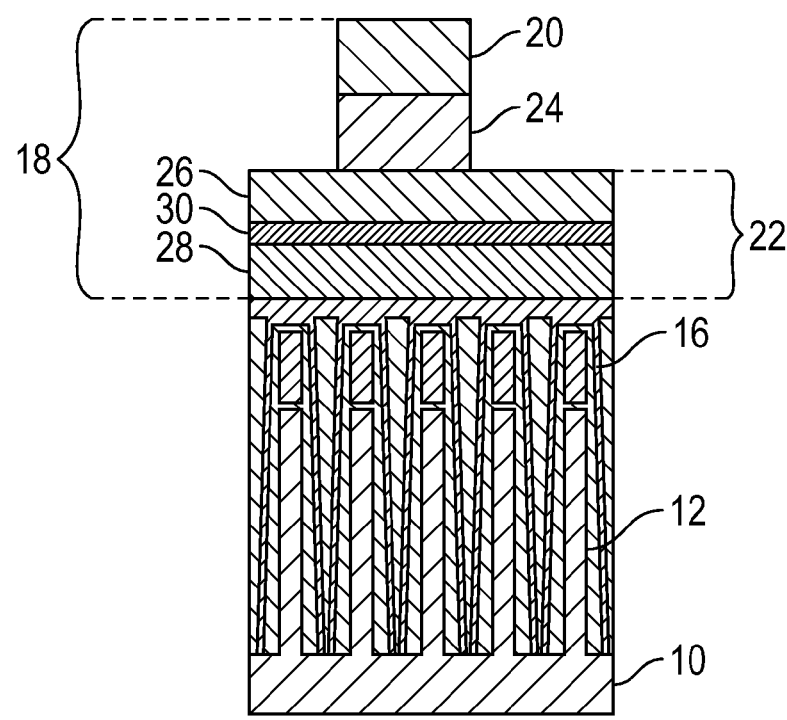

In embodiments and as shown in FIGS. 5-10, the multi-layered hardmask stack 18 is patterned to form a patterned multi-layered hardmask stack 18 having a tapered fin masking configuration with a shortened region 32 and an elongated region 34, with the shortened region 32 and elongated region 34 employed to mask the fins 12 for selective etching as described in further detail below. To form the tapered fin masking configuration, a multi-step patterning technique is employed to separately pattern the uppermost layer 20 with a pattern corresponding to the elongated region 34 and the intermediate layer 24 with a pattern corresponding to the shortened region 32. For example, in an embodiment, a conventional lithography technique is employed to first pattern the uppermost layer 20 by patterning a photoresist layer 36 in the configuration of the elongated region 34, followed by etching the uppermost layer 20 with an etchant that is selective to the material of the uppermost layer 20 over the intermediate layer 24. For example, in embodiments in which the uppermost layer 20 includes low temperature nitride, the uppermost layer 20 may be selectively dry etched with $CF_4/CHF_3/CH_3F$ in accordance with conventional techniques. After patterning the uppermost layer 20, the photoresist layer 36 may be removed and another photoresist layer 38 may be patterned in the configuration of the shortened region 32, as shown in FIG. 9, followed by etching the intermediate layer 24 with an etchant that is selective to the material of the intermediate layer 24 over the uppermost layer 20. For example, in embodiments in which the intermediate layer 24 includes low temperature oxide, the intermediate layer 24 may be selectively dry etched with $C_4F_8/Ar$ in accordance with conventional techniques. After patterning of the intermediate layer 24, the photoresist layer 38 may be removed.

Figure 11:
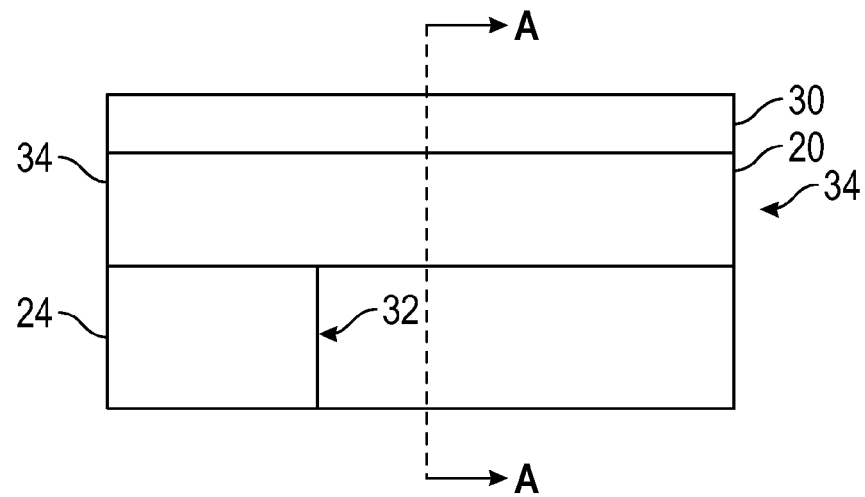
Figure 12:
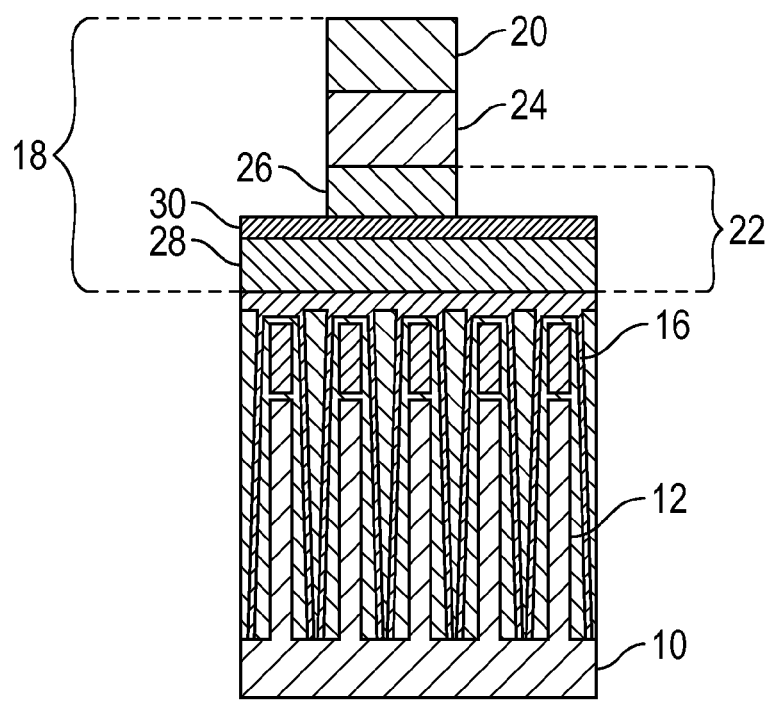
Figure 13:
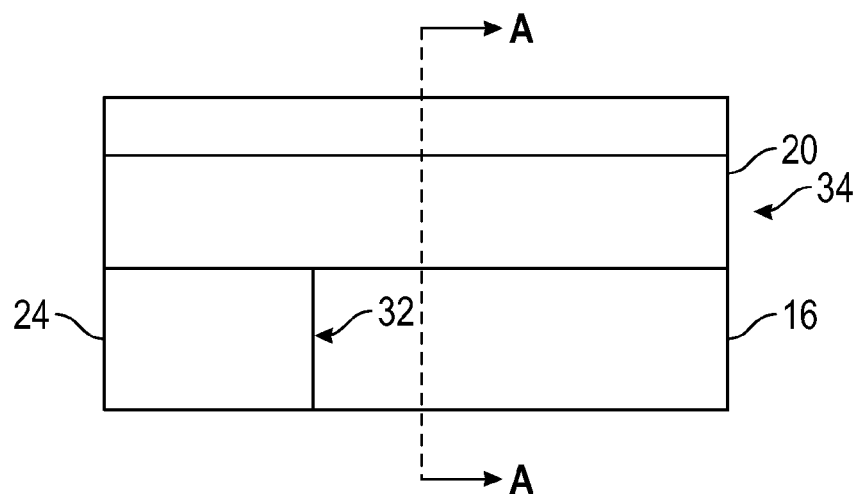
Figure 14:
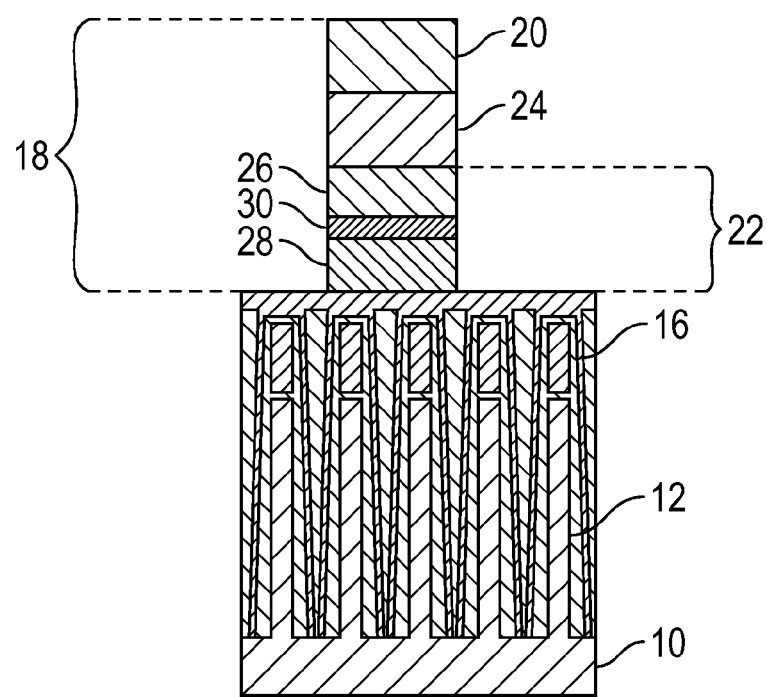

In embodiments and referring to FIGS. 11-14, the pattern of the uppermost layer 20 and the intermediate layer 24 is transferred into the underlying layers of the multi-layered hardmask stack 18 with the cap layer 16 functioning as an etch stop. In particular, in the embodiments shown, exposed portions of the sandwiched structure 22 are etched by first etching an uppermost organic planarization layer 26 with an OPL etchant such as $HBr/O_2/CO_2$ or COS/He to exposed the separation layer 30 (as shown in FIGS. 11 and 12), followed by etching exposed portions of the separation layer 30 that includes IRAD oxide with an IRAD oxide etchant such as $C_4F_8/Ar$, followed again by etching exposed portions of the lowermost organic planarization layer 28 with $HBr/O_2/CO_2$ or COS/Heto exposed underlying portions of the cap layer 16, as shown in FIGS. 13 and 14.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing an exemplary embodiment. It being understood that various changes may be made in the function and arrangement of elements described in an exemplary embodiment without departing from the scope as set forth in the appended claims.

In embodiments and as shown in FIGS. 15-18, the method proceeds with masking a region of the fins 12 that is adjacent to the shortened region 32 of the patterned multi-layered hardmask stack 18 with a second mask 40. The region of fins 12 masked with the second mask 40 is free from the patterned multi-layered hardmask stack 18. More specifically, the patterned multi-layered hardmask stack 18 is absent from directly over the region of fins 12 over which the second mask 40 is formed in a vertical direction as viewed in the accompanying FIGS. In this regard, the second mask 40 is formed adjacent to shortened region 32 of the patterned multi-layered hardmask stack 18 with a bottom of the second mask 40 disposed on the cap layer 16, on even plane with a bottom of the multi-layered hardmask stack 18.

Figure 15:
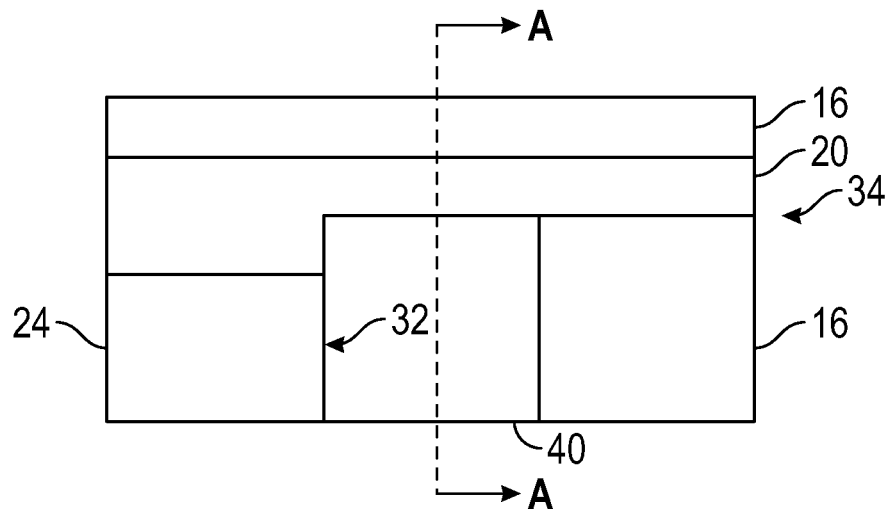
Figure 16:
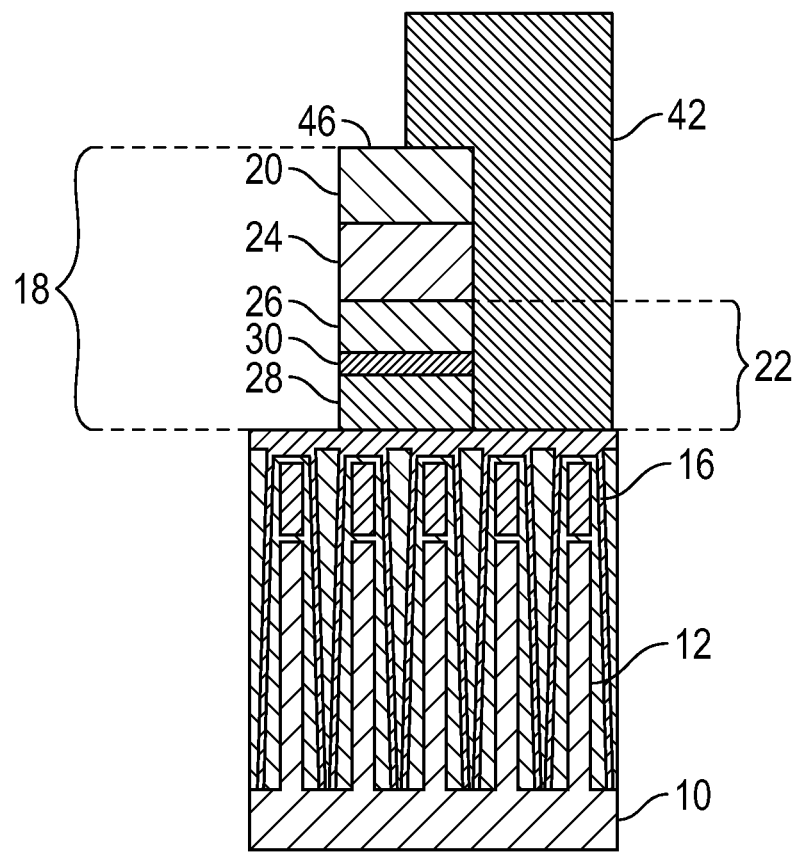
Figure 17:
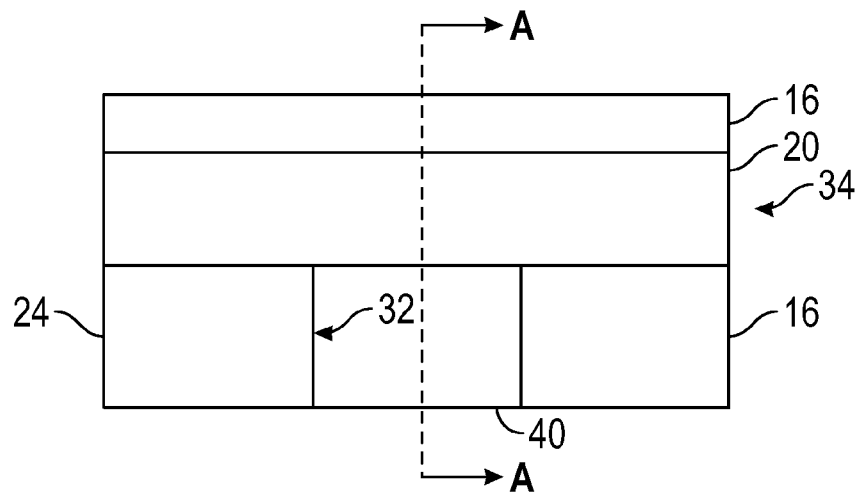
Figure 18:
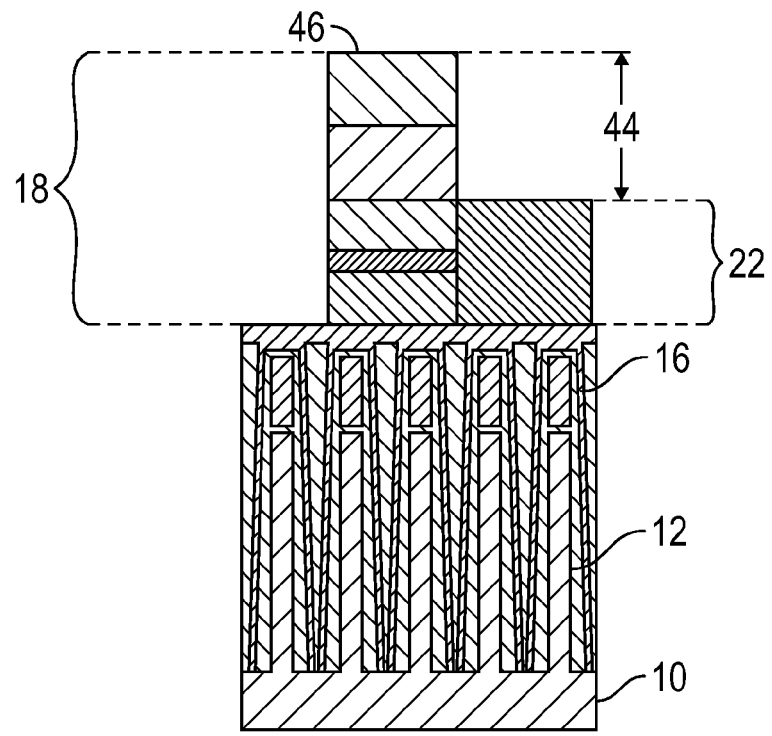

In embodiments, to mask the region of fins 12 adjacent to the shortened region 32 of the patterned multi-layered hardmask stack 18 with the second mask 40, a second mask layer (not shown) is patterned, such as through conventional lithography techniques, to form an intermediate second mask layer 42 disposed over the region of fins 12 adjacent to the shortened region 32 of the patterned multi-layered hardmask stack 18 and further disposed over a portion of the patterned multi-layered hardmask stack 18, as shown in the exemplary embodiment of FIGS. 15 and 16. In embodiments, the uppermost layer 20 of the multi-layered hardmask stack 18 has a materially different etch rate than the second mask 40. For example, in embodiments the uppermost layer 20 of the patterned multi-layered hardmask stack 18 includes LTN and the second mask 40 includes the material having substantially the same etch rate as the organic planarization layers 26, 28 for reasons to be described below. In embodiments, the intermediate second mask layer 42 is recessed with an etchant (e.g., the OPL etchant described above) that is selective to the second mask layer over the uppermost layer 20 of the multi-layered hardmask stack 18, with the patterned multi-layered hardmask stack 18 free from the second mask layer overlying the uppermost layer 20 thereof after recessing the intermediate second mask layer 42. In embodiments and referring to FIGS. 16 and 18, the intermediate second mask layer 42 is recessed to a depth 44 beneath an upper surface 46 of the uppermost layer 20 of the patterned multi-layered hardmask stack 18.

Figure 19:
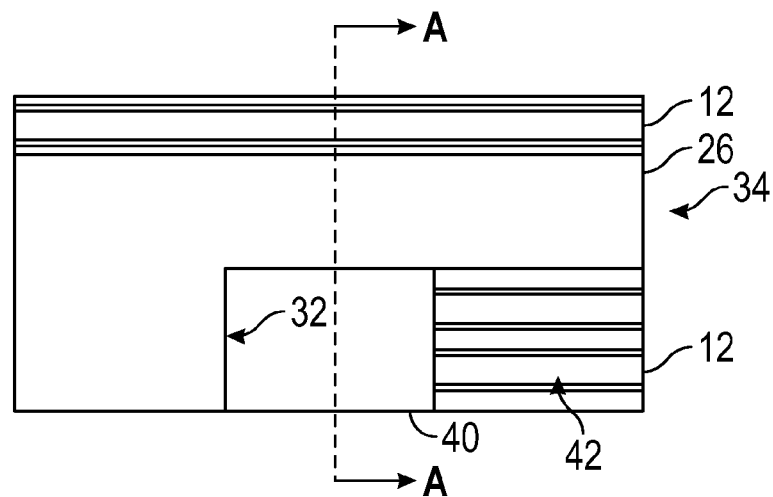
Figure 20:
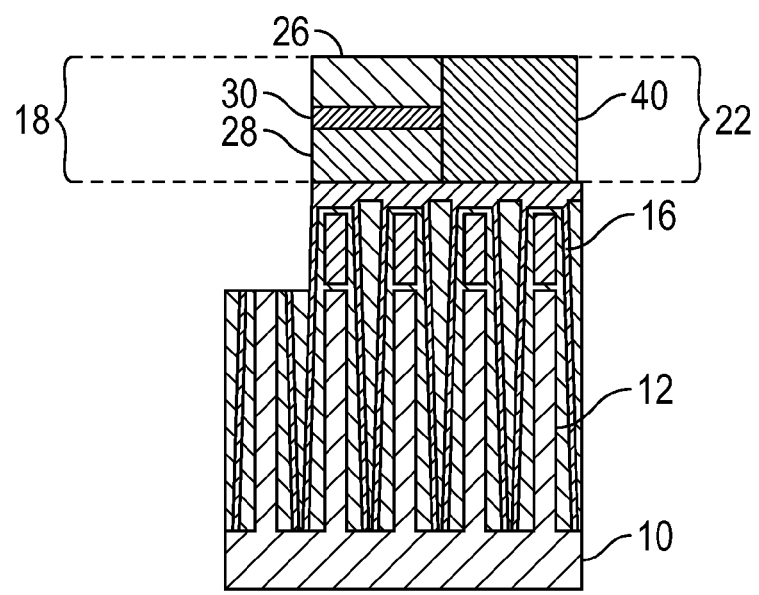

In an embodiment and as shown in FIGS. 19 and 20, the cap layer 16 and the uppermost layer 20 of the multi-layered hardmask stack 18 include material having substantially the same etch rate in a first etchant, e.g., the cap layer 16 may include a nitride such as silicon nitride and the uppermost layer 20 may also include a nitride such as LTN. In this embodiment, the uppermost layer 20 of the patterned multi-layered hardmask stack 18 and exposed portions of the cap layer 16 in unmasked areas 42 can be concurrently etched using, e.g., a nitride etchant as the first etchant to minimize processing steps and accomplish both removal of the uppermost layer 20 and exposure of fins 12 in unmasked areas 42 for later etching. Referring to FIGS. 19 and 20, the cap layer 16 is removed in all areas left exposed outside of the patterned multi-layered hardmask stack 18 and also outside of the second mask 40, as viewed in the top view of FIG. 19.

Figure 21:
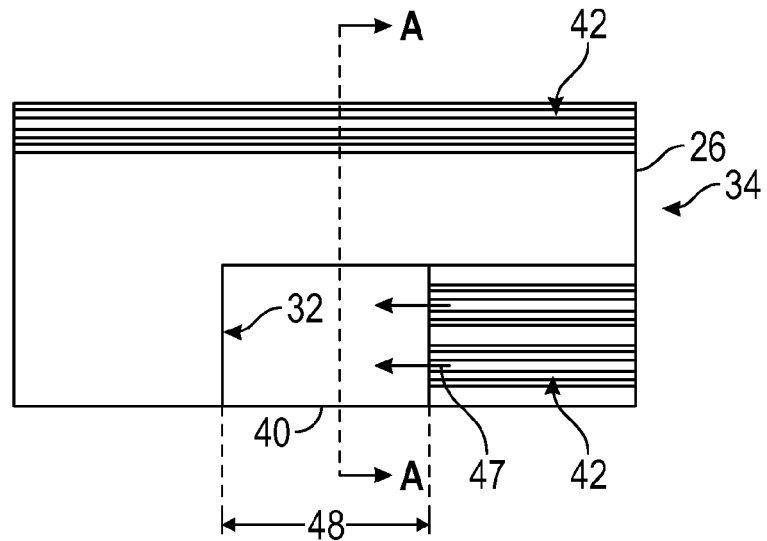
Figure 22:
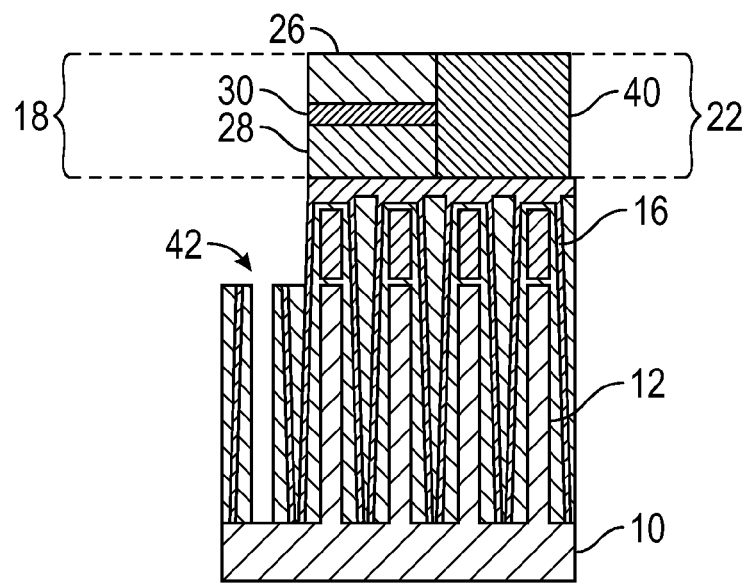
Figure 23:
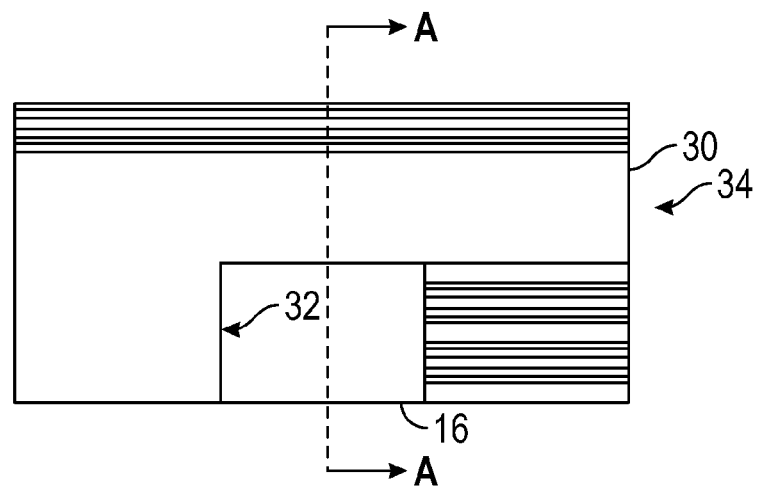
Figure 24:
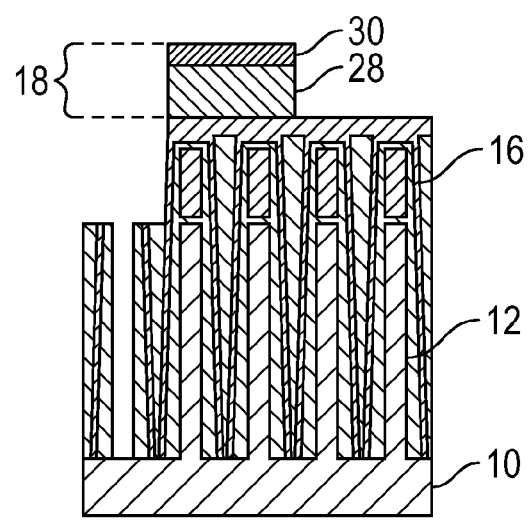

In embodiments and referring to FIGS. 21 and 22, fins 12 in unmasked areas 42 are etched after forming the second mask 40 using an appropriate etchant for the semiconductor substrate 10. For example, in embodiments, the exposed fins 12 are isotropically etched such as by a reactive ion etching with fluorine, which is isotropic and very selective to $SiO_2$ and SiN, after etching the cap layer 16 in the unmasked areas 42. Isotropic etching generally propagates equally in all directions and, thus, isotropically etching the fins 12 in the unmasked results in both vertical fin etching (as viewed in FIG. 22) as well as lateral fin etching (as indicated by arrows 47 in FIG. 21), with portions of fins 12 underlying the second mask 40 being etched. However, due to the presence of the second mask 40, undesirable etching of portions of fins 12 underlying the shortened region 32 of the patterned multi-layered hardmask structure is avoided and such portions of the fins 12 remain unetched. In this regard, the second mask 40 covers sufficient area to isolate lateral etching to an area beneath the second mask 40 without etching propagating laterally beneath the shortened region 32 of the patterned multi-layered hardmask stack 18. Length 48 of the second mask 40 may be adjusted in this regard based upon etch conditions that are desired to sufficiently etch the fins 12 in the unmasked areas 42. Additionally, in embodiments, at least a portion of each of the fins 12 underlying the second mask 40 remain after isotropically etching the fins 12 to provide a buffer against lateral propagation of fin etching beneath the shortened region 32 of the patterned multi-layered hardmask stack 18.

Figure 25:
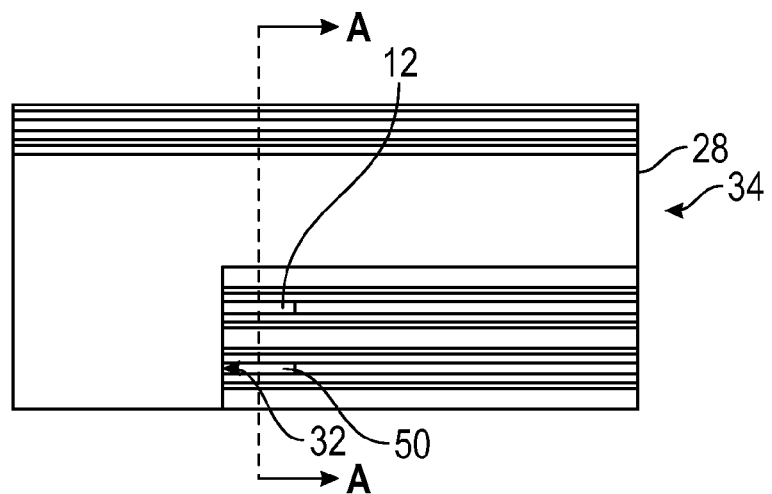
Figure 26:
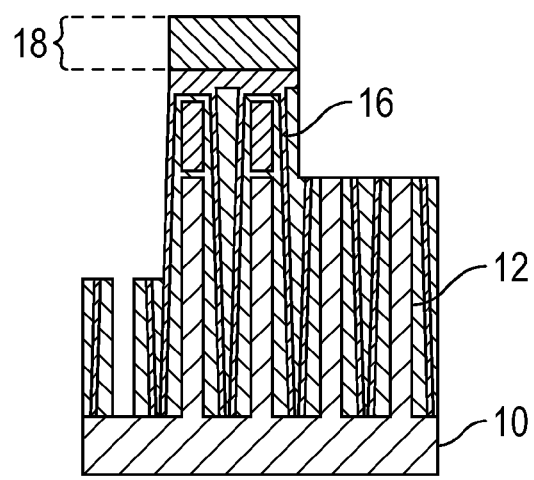

After etching the fins 12 in the unmasked areas 42 and in embodiments as shown in FIGS. 23-26, the second mask 40 is removed with at least one layer of the patterned multi-layered hardmask stack 18 remaining disposed over the fins 12. In particular, the second mask 40 is removed to enable etching of end portions 50 of the fins 12 that were masked with the second mask 40. As alluded to above, the second mask 40 and the OPL layers 26, 28 may include material having substantially the same etch rate in a particular etchant. In this embodiment, the second mask 40 is concurrently removed along with the uppermost organic planarization layer 26 of the sandwiched structure 22 with at least a portion of the separation layer 30 remaining after removal of the second mask 40 and the uppermost organic planarization layer 26. The same OPL etchant as described above may be employed for etching the second mask 40 and the uppermost organic planarization layer 26. After removing the second mask 40, portions of the cap layer 16 that were beneath the second mask 40 are exposed and may be removed in the same manner as described above to exposed the end portions 50 of the fins 12 that were beneath the second mask 40, as shown in FIGS. 25 and 26. The separation layer 30 may have substantially the same etch rate in a particular etchant as the cap layer 16 (or an individual layer within the cap layer 16) such that the separation layer 30 may be removed concurrently with etching of the exposed portions of the cap layer 16.

Figure 27:
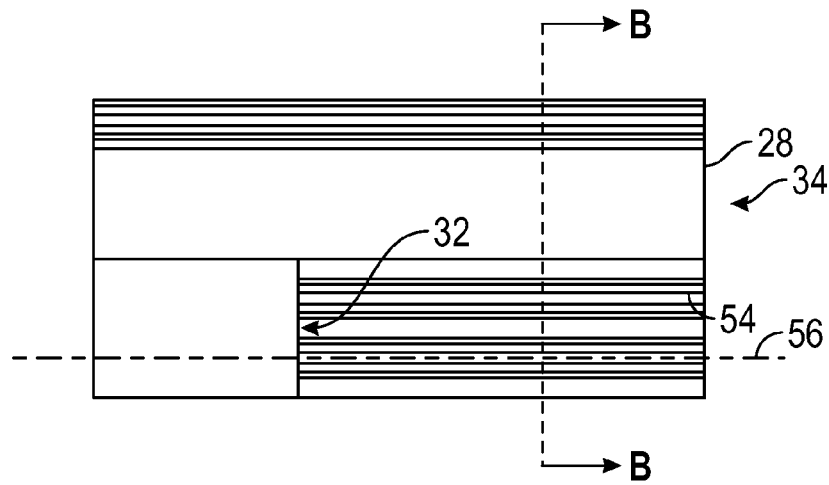
Figure 28:
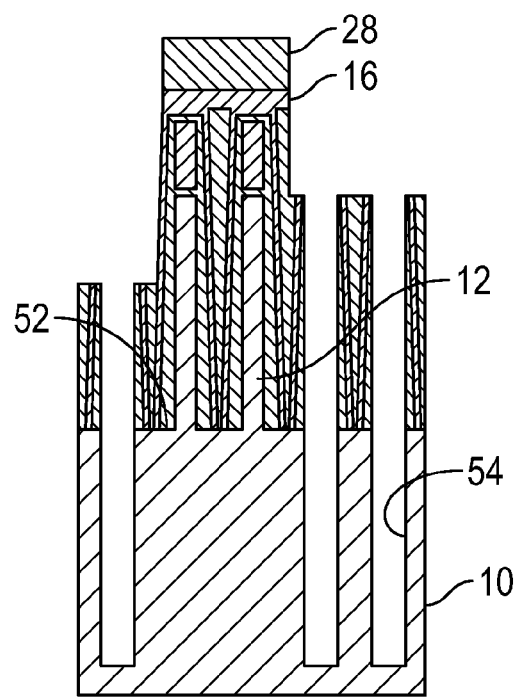

In embodiments and as shown in FIGS. 27 and 28 with continued reference to FIGS. 25 and 26 and with FIG. 28 showing cross-section taken at line B-B, the end portions 50 of the fins 12 adjacent to the shortened region 32 of the patterned multi-layered hardmask stack 18 are etched after removing the second mask 40 and after removing the exposed portions of the cap layer 16. In particular, the end portions 50 of the fins 12 are etched with at least a portion of the lowermost organic planarization layer 28 of the sandwiched structure 22 remaining in place during etching of the end portions 50 to maintain the desired tapered fin masking configuration that is defined by the patterned multi-layered hardmask stack 18. In embodiments, the end portions 50 of the fins 12 adjacent to the shortened region 32 of the patterned multi-layered hardmask stack 18 are anisotropically etched to provide sharp definition to ends of the fins 12 beneath the shortened region 32 and to remove remnants of the end portions 50 of the fins 12 that remain after isotropic etching. Anisotropically etching may be conducted through a conventional technique such as by reactive ion etching with $CF_4$ or $SF_6$. Because areas where fins 12 were previously removed by isotropic etching are again subject to anisotropic etching, etching may propagate into the semiconductor substrate 10, deeper than a bottom 52 of the fins 12 that are attached to the semiconductor substrate 10, to form trenches 54. The trenches 54 are thus defined in portions of the semiconductor substrate 10 that remained exposed after patterning of the multi-layered hardmask stack 18, as well as in portions of the semiconductor substrate 10 directly underlying an axis 56 passing through a longitudinal dimension of the shortened fins 58, as shown in FIGS. 27 and 28.

Figure 29:
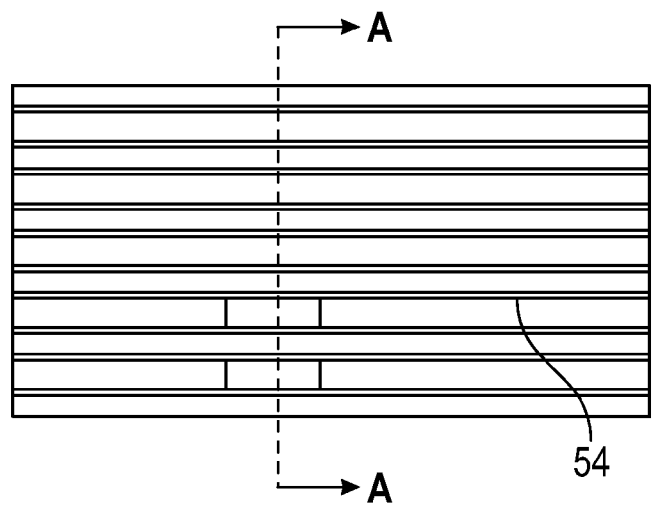
Figure 30:
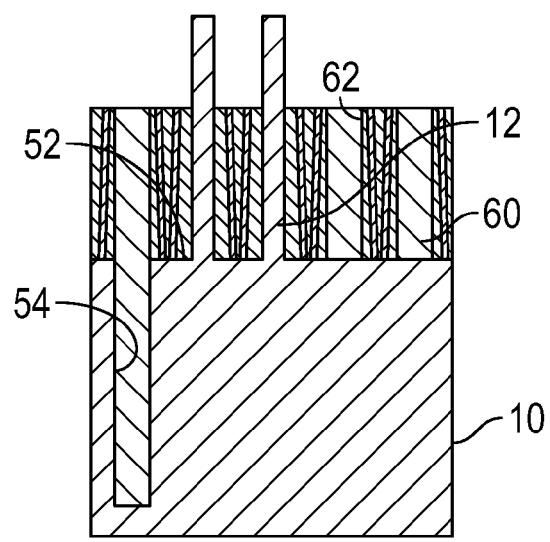

In embodiments and referring to FIGS. 29 and 30 with continued reference to FIGS. 25-28, the lowermost organic planarization layer 28 of the sandwiched structure is removed after etching the end portions 50 of fins 12 adjacent to the shortened region 32 of the patterned multi-layered hardmask stack 18, with portions of the fins 12 underlying the lowermost organic planarization layer 28 of the sandwiched structure remaining in place. The lowermost organic planarization layer 28 may be removed by etching with the OPL etchant as described above. Gaps 62 and trenches 54 formed by etching the fins 12 may then be filled with a dielectric material 60, such as silicon oxide, and the dielectric material 60 may be recessed through conventional chemical mechanical planarization/etch-back techniques to result in the configuration shown in FIG. 30.

Figure 31:
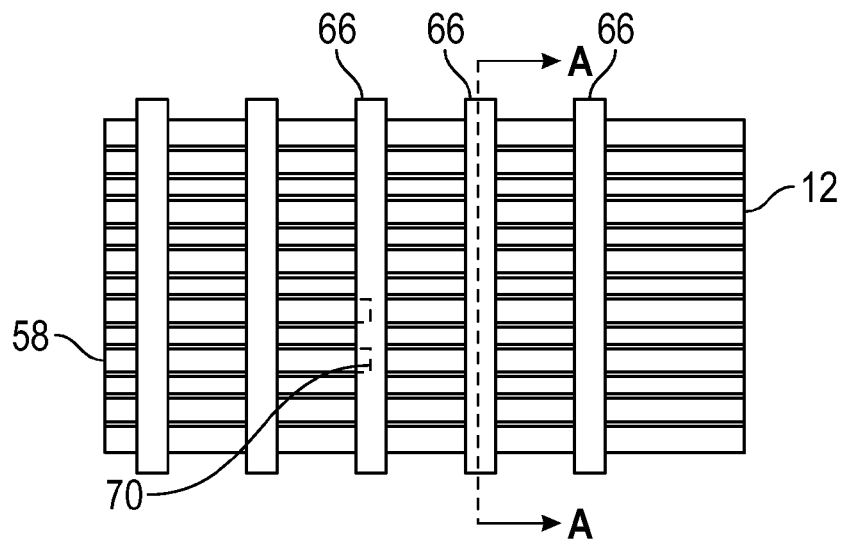
Figure 32:
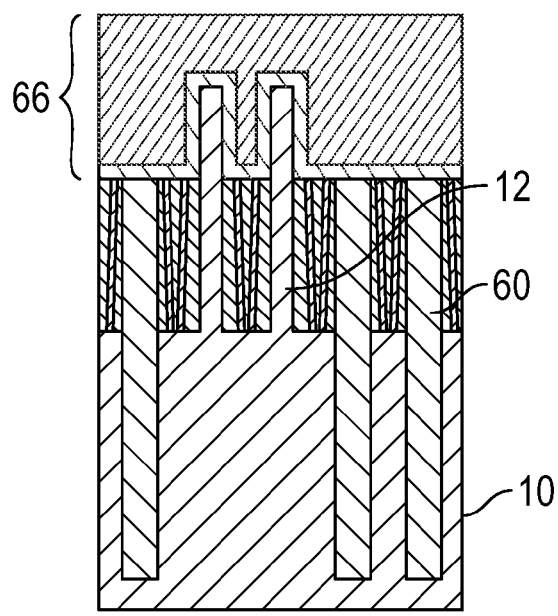

In embodiments and as shown in FIGS. 31 and 32, a gate electrode structure 66 may then be formed over the fins 12, 58 and the dielectric material 60 disposed in the gaps 62 and trenches 54. The gate electrode structures 66 are formed with ends 70 of shortened fins 58 buried directly beneath one of the gate electrode structures 66. Further conventional front-end-of-line (FEOL) and back-end-of-line (BEOL) fabrication techniques, although not shown, are then conducted to complete the FinFET device.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of fabricating a FinFET device, wherein the method comprises:
   providing a semiconductor substrate comprising a plurality of fins;
   forming a multi-layered hardmask stack over the plurality of fins;
   patterning the multi-layered hardmask stack to form a patterned multi-layered hardmask stack having a tapered fin masking configuration with a shortened region and an elongated region;
   masking a region of fins adjacent to the shortened region of the patterned multi-layered hardmask stack with a second mask, wherein the region of fins masked with the second mask is free from the patterned multi-layered hardmask stack;
   etching fins in unmasked areas that remain unmasked from the second mask after forming the second mask;
   removing the second mask with at least one layer of the patterned multi-layered hardmask stack remaining disposed over the fins after etching the fins in the unmasked areas; and
   etching end portions of the fins adjacent to the shortened region of the patterned multi-layered hardmask stack after removing the second mask.

2. The method of claim 1, wherein masking the region of fins adjacent to the shortened region of the patterned multi-layered hardmask stack with the second mask comprises patterning a second mask layer to form an intermediate second mask layer disposed over the region of fins adjacent to the shortened region of the patterned multi-layered hardmask stack and further disposed over a portion of the multi-layered hardmask stack.

3. The method of claim 2, wherein an uppermost layer of the multi-layered hardmask stack has a materially different etch rate than the second mask, wherein the method further comprises recessing the intermediate second mask layer with an etchant selective to the second mask layer over the uppermost layer of the patterned multi-layered hardmask stack with the patterned multi-layered hardmask stack free from the second mask layer overlying the uppermost layer thereof after recessing the intermediate second mask layer.

4. The method of claim 3, wherein recessing the intermediate second mask layer comprises recessing the intermediate second mask layer to a depth beneath an upper surface of the uppermost layer of the patterned multi-layered hardmask stack.

5. The method of claim 1, wherein a cap layer is disposed over the fins, between the fins and the multi-layered hardmask stack and between the fins and the second mask, wherein the cap layer and an uppermost layer of the multi-layered hardmask stack comprise material having substantially the same etch rate in a first etchant, and wherein the method further comprises concurrently etching the uppermost layer of the patterned multi-layered hardmask stack and exposed portions of the cap layer in unmasked areas.

6. The method of claim 5, wherein the uppermost layer of the multi-layered hardmask stack comprises a nitride, wherein the cap layer comprises a nitride, and wherein etching the uppermost layer of the patterned multi-layered hardmask stack and exposed portions of the cap layer in unmasked areas comprises concurrently etching the uppermost layer of the patterned multi-layered hardmask stack and exposed portions of the cap layer in the unmasked areas with a nitride etchant.

7. The method of claim 5, wherein the multi-layered hardmask stack further comprises a sandwiched structure disposed between the uppermost layer of the multi-layered hardmask stack and the fins, wherein the sandwiched structure comprises two organic planarization layers with a separation layer disposed therebetween and comprising a different material from the organic planarization layers, and wherein removing the second mask comprises removing the second mask and an uppermost organic planarization layer of the sandwiched structure with at least a portion of the separation layer remaining after removal of the second mask and the uppermost organic planarization layer.

8. The method of claim 5, wherein etching the fins in the unmasked areas after forming the second mask comprises isotropically etching the fins exposed after etching the cap layer in the unmasked areas, wherein a portion of the fins underlying the second mask are laterally etched and wherein portions of fins underlying the shortened region of the patterned multi-layered hardmask stack remain unetched.

9. The method of claim 1, wherein etching the fins in the unmasked areas comprises isotropically etching fins in the unmasked areas after forming the second mask, wherein a portion of the fins underlying the second mask are laterally etched and wherein portions of fins underlying the shortened region of the patterned multi-layered hardmask stack remain unetched.

10. The method of claim 9, wherein at least a portion of each of the fins underlying the second mask remain after isotropically etching the fins.

11. The method of claim 10, wherein etching the end portions of the fins adjacent to the shortened region of the patterned multi-layered hardmask stack comprises anisotropically etching the end portions of the fins adjacent to the shortened region of the patterned multi-layered hardmask stack after removing the second mask.

12. The method of claim 1, wherein the multi-layered hardmask stack comprises a sandwiched structure comprising two organic planarization layers with a separation layer disposed therebetween and comprising a different material from the organic planarization layers, and wherein removing the second mask comprises removing the second mask and an uppermost organic planarization layer of the sandwiched structure with at least a portion of the separation layer remaining after removal of the second mask and the uppermost organic planarization layer.

13. The method of claim 12, wherein the second mask and the organic planarization layers of the sandwiched structure comprise material having substantially the same etch rate, and wherein removing the second mask comprises concurrently removing the second mask and the uppermost organic planarization layer of the sandwiched structure with at least a portion of the separation layer remaining after removal of the second mask and the uppermost organic planarization layer.

14. The method of claim 13, wherein etching the end portions of the fins adjacent to the shortened region of the patterned multi-layered hardmask stack comprises etching the end portions with at least a portion of a lowermost organic planarization layer of the sandwiched structure remaining in place during etching of the end portions.

15. The method of claim 14, further comprising removing the lowermost organic planarization layer of the sandwiched structure after etching the end portions of the fins adjacent to the shortened region of the patterned multi-layered hardmask stack, wherein portions of the fins underlying the lowermost organic planarization layer of the sandwiched structure remain in place.

16. The method of claim 1, further comprising filling gaps formed by removal of the fins with a dielectric material.

17. The method of claim 16, further comprising forming a gate electrode structure over the fins and the dielectric material disposed in the gaps.

18. The method of claim 17, wherein forming the gate electrode structure comprises forming the gate electrode structure with ends of shortened fins buried directly beneath the gate electrode structure.

19. A method of fabricating a FinFET device, wherein the method comprises:

providing a semiconductor substrate comprising a plurality of fins;

forming a multi-layered hardmask stack over the plurality of fins, wherein the multi-layered hardmask stack comprises two organic planarization layers with a separation layer disposed therebetween and comprising a different material from the organic planarization layers;

patterning the multi-layered hardmask stack to form a patterned multi-layered hardmask stack having a tapered fin masking configuration with a shortened region and an elongated region;

masking a region of fins adjacent to the shortened region of the patterned multi-layered hardmask stack with a second mask, wherein the region of fins masked with the second mask is free from the patterned multi-layered hardmask stack;

etching fins in unmasked areas that remain unmasked from the second mask after forming the second mask;

concurrently removing the second mask and an uppermost organic planarization layer in the multi-layered hardmask stack with at least a portion of the separation layer remaining after removal of the second mask and the uppermost organic planarization layer; and etching end portions of the fins adjacent to the shortened region of the patterned multi-layered hardmask stack in the unmasked areas after removing the second mask, wherein a lowermost organic planarization layer of the multi-layered hardmask stack remains in place during etching of the end portions of the fins adjacent to the shortened region of the patterned multi-layered hardmask stack.

* * * * *